United States Patent
Diaz et al.

(10) Patent No.: US 9,425,324 B2
(45) Date of Patent: Aug. 23, 2016

(54) SEMICONDUCTOR DEVICE AND CHANNEL STRUCTURE THEREOF

(71) Applicant: Taiwan Semiconductor Manufacturing Company Limited, Hsinchu (TW)

(72) Inventors: Carlos H. Diaz, Mountain View, CA (US); Jean-Pierre Colinge, Hsinchu (TW)

(73) Assignee: Taiwan Semiconductor Manufacturing Company Limited, Hsinchu (TW)

(*) Notice: Subject to any disclaimer, the term of this patent is extended or adjusted under 35 U.S.C. 154(b) by 0 days.

(21) Appl. No.: 14/501,569

(22) Filed: Sep. 30, 2014

(65) Prior Publication Data

US 2016/0093745 A1    Mar. 31, 2016

(51) Int. Cl.
| | |
|---|---|
| *H01L 29/786* | (2006.01) |
| *H01L 29/423* | (2006.01) |
| *H01L 29/10* | (2006.01) |
| *H01L 29/06* | (2006.01) |
| *H01L 29/51* | (2006.01) |

(52) U.S. Cl.
CPC ..... *H01L 29/78696* (2013.01); *H01L 29/0657* (2013.01); *H01L 29/1033* (2013.01); *H01L 29/42392* (2013.01); *H01L 29/51* (2013.01); *H01L 29/78603* (2013.01)

(58) Field of Classification Search
CPC ........... H01L 29/78696; H01L 29/1033; H01L 29/42392; H01L 29/0657; H01L 29/78603; H01L 29/51
USPC ............................................. 257/29
See application file for complete search history.

(56) References Cited

U.S. PATENT DOCUMENTS

| | | | |
|---|---|---|---|
| 9,076,686 B1* | 7/2015 | Karda | H01L 27/11582 |
| 2008/0079041 A1 | 4/2008 | Suk et al. | |
| 2008/0149914 A1* | 6/2008 | Samuelson | B82Y 10/00 257/9 |
| 2009/0032849 A1 | 2/2009 | Higashino | |
| 2010/0078698 A1* | 4/2010 | Son | B82Y 10/00 257/296 |
| 2010/0301402 A1 | 12/2010 | Masuoka | |
| 2013/0307513 A1* | 11/2013 | Then | H01L 29/66469 323/311 |
| 2014/0166981 A1* | 6/2014 | Doyle | H01L 29/66666 257/24 |
| 2014/0231886 A1* | 8/2014 | Shen | H01L 31/022408 257/290 |
| 2015/0048292 A1* | 2/2015 | Park | H01L 27/2454 257/2 |
| 2015/0091058 A1* | 4/2015 | Doyle | H01L 29/7827 257/192 |
| 2015/0171032 A1* | 6/2015 | Colinge | H01L 23/60 257/355 |

OTHER PUBLICATIONS

Korean Office Action; Application No. 10-2014-0186265; dated Dec. 18, 2015.

* cited by examiner

*Primary Examiner* — Christine Enad
(74) *Attorney, Agent, or Firm* — Jones Day

(57) ABSTRACT

A semiconductor device having a composite structure is disclosed, which includes a channel structure having an inner core strut that extends substantially along a channel direction of the semiconductor device and an outer sleeve layer disposed on the inner core strut. The inner core strut mechanically supports the sleeve member across a channel length of the semiconductor device.

16 Claims, 14 Drawing Sheets

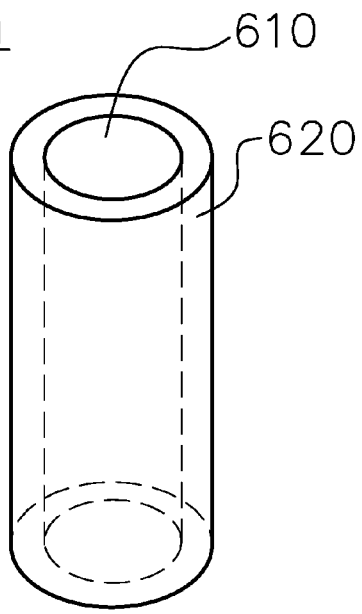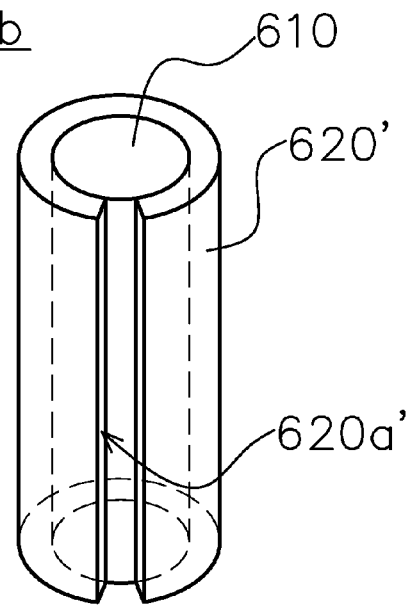
Fig.6A　　　　　Fig.6B
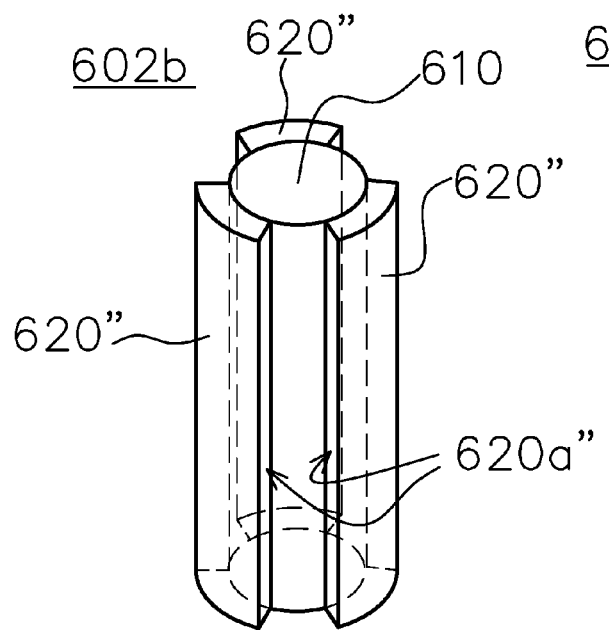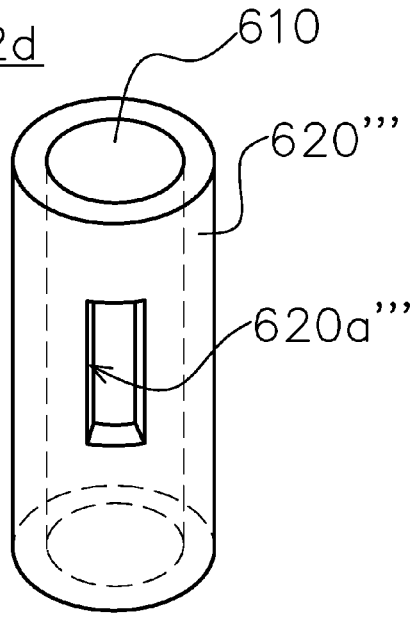
Fig.6C　　　　　Fig.6D

SEMICONDUCTOR DEVICE AND CHANNEL STRUCTURE THEREOF

TECHNICAL FIELD

The present invention relates generally to semiconductor devices, and, more particularly, to 3-dimensional semiconductor devices incorporating 2-dimensional layered channel materials.

BACKGROUND

Performance and scalability of current silicon-based transistors is reaching fundamental limits despite the implementation of various enhancement techniques. Alternative semiconductor materials such as Ge and III-V semiconductors are being considered, but the ultra-thin body performance scalability of these relatively costly materials remains a challenge.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-D illustrate isometric views of a portion of a semiconductor device in accordance with various embodiments of the instant disclosure.

DETAILED DESCRIPTION

Figure 1A:
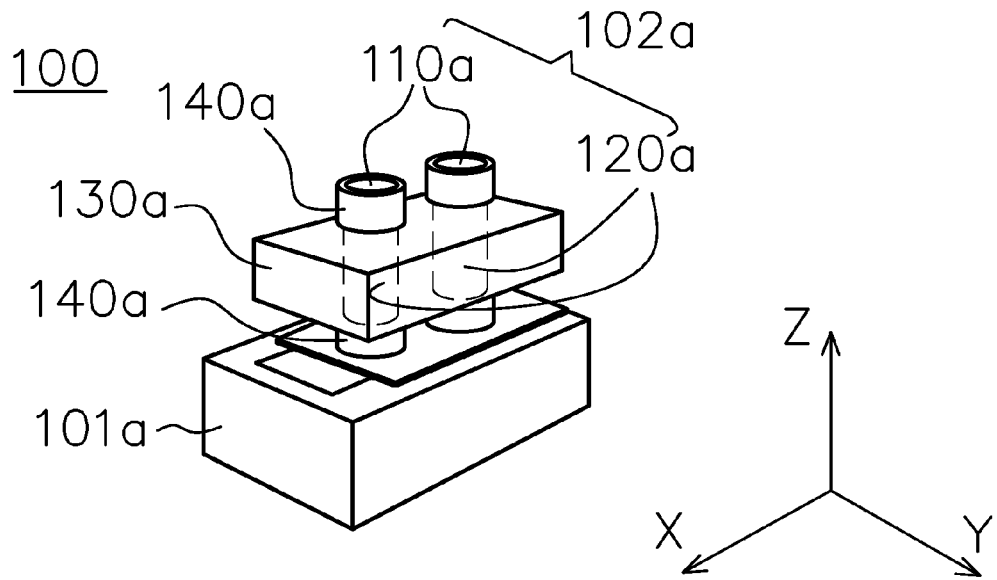
FIGS. 1A-C illustrate perspective views of semiconductor devices in accordance with embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the ease and accuracy of orientation referral, an x-y-z coordinate reference is provided, in which the x-axis is generally orientated along a substrate surface in a first direction, the y-axis is generally oriented along the substrate surface perpendicular to the x-axis, while the z-axis is oriented generally along the vertical direction with respect to the planar surface of a substrate (which, in most cases, defined by the x-y plane).

The performance and scalability of current silicon-based transistors is reaching fundamental limits despite the implementation of various enhancement techniques, such as novel device architectures for enhanced electrostatic control, transport enhancement by strained channels, improved dopant activation, and parasitic resistance reduction. Alternative semiconductors materials such as Ge, III-V are also being considered, but the ultra-thin body performance scalability of these relatively costly materials remains a challenge.

In contrast, mono-layers or ultra thin layers of 2D transition metal dichalcogenide s "TMDs", which typically has a general formula of $TX_2$ where T usually denotes a transition metal from periodic table column {IVB, VB, VIB} and X denotes one element from the group of {S, Se, or Te}, appear to have outstanding transport properties. These layered materials exhibit a diverse range of electrical properties, varying from indirect band gap in the bulk to direct band gap at thin-layer thicknesses. The unique properties of the TMD materials have shown great potential for applications in nano-electronics.

Structural wise, the layered TMD can be regarded as stacking two-dimensional X-T-X sandwiches. The bonding within each sandwich layer is of the strong covalent type, giving it outstanding intra-layer strength, while the bonding between the sandwich layers is of the weak van der Waals type. The crystal structures of the layered TMD are usually described as 1T, 2H, 3R, 4Ha, 4Hb, 6R phases [1, 2]. The integer denotes the number of X-T-X layers per unit cell perpendicular to the layers, while T, H, and R denote trigonal, hexagonal, rhombohedral symmetries, respectively. Introducing foreign atoms or molecules between the weak coupling sandwich layers is the process of intercalation. Intercalation not only increases the layer separation, but also provides a powerful way to tune the electronic properties of the host materials.

On the other hand, 2-D films of certain elements, such as silicon, germanium, and tin, behave like topological insulators with possible room-temperature superconducting properties at the edges thereof. Specifically, silicene, germanene and stannene are the 2-D allotrope of silicon (Si), germanium (Ge), and tin (Sn), respectively. A topological insulator behaves like an insulator in its interior while exhibiting conductive properties at the boundary portions thereof (e.g., the surfaces of a bulk or edges of a film), meaning that charge carriers can only move along the boundary portion of the material. Particularly, it has been shown that 2-D tin (stannene) behaves like a topological insulator with possible room-temperature superconducting properties at the edges of the stannene ribbons.

Intercalated TMD, graphite, and other layered structural transition metal nitrides (TMDs) have received considerable attention due to their special structures and transport properties, especially for superconductivities. Particularly, new interests have been aroused since the recent discoveries of superconductivities in graphite intercalation compounds (GIC's) YbC6, CaC6, CuxTiSe2, and stannene. The unique properties make the 2-D TMDs and the topological insulator materials promising candidates for use in field effect transistors ("FETs"). For instance, a source/drain doping process will no longer be necessary like that required by devices adopting conventional silicon-based materials, since the surfaces of the these 2-D layered materials are metallic/conductive. Moreover, conduction channels made by these 2-D layered materials can be turned on by applying suitable gate voltages.

In the form of thin films, some topological insulators such as Sb2Te3 (antimony telluride), Bi2Se3 (bismuth selenide) or Bi2Te3 (bismuth telluride) can exhibit a metallic or a semiconductor behavior, depending on the film thickness. The width of the band gap can be controlled by the thin film thickness. For instance, thinner films of such materials may exhibit semiconductor characteristics, while thicker films thereof exhibit metallic properties. Thus it is possible to fabricate a field-effect transistor where the thicker source and drain are metallic and the thinner channel region is a semiconductor.

Figure 1B:
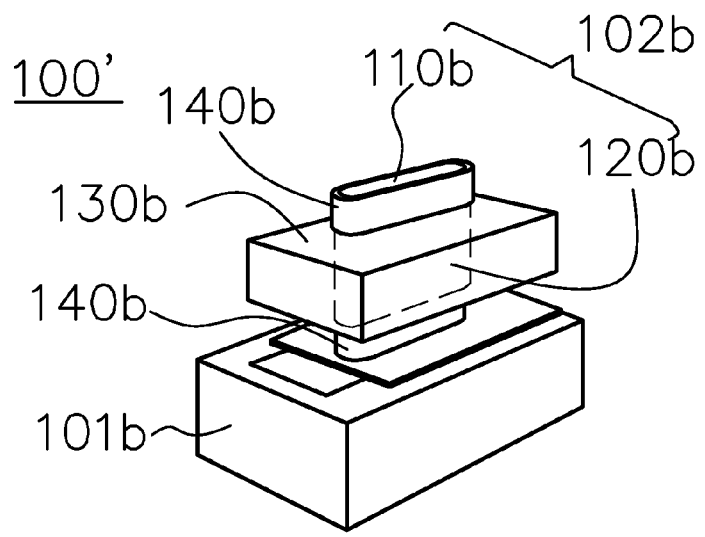
Figure 1C:
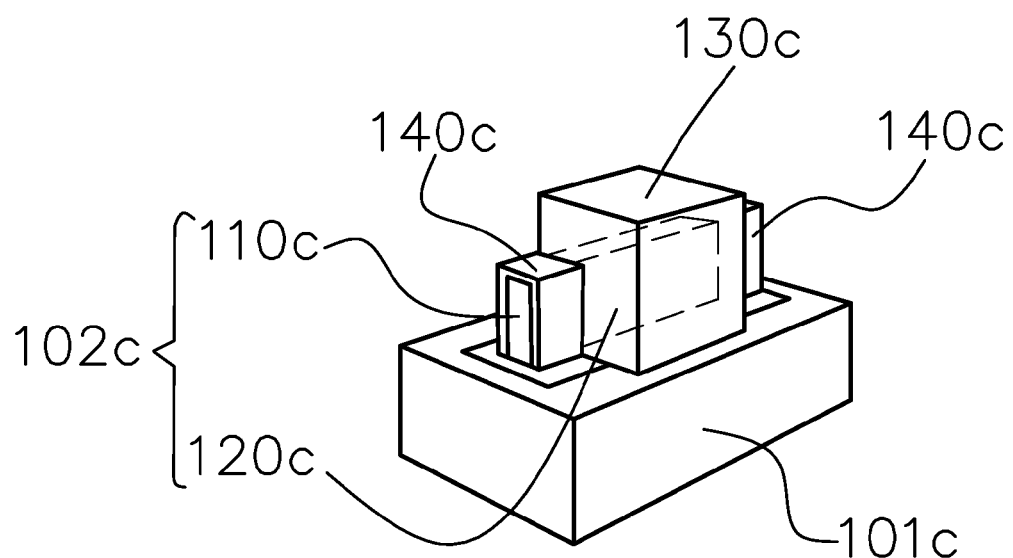

FIGS. 1A-C illustrate perspective views of semiconductor devices in accordance with embodiments of the instant disclosure. As employed in the instant disclosure, the term semiconductor device refers generally to a gate-all-around (GAA) transistor, which may include any nanowire-based, multi-gate device. Other transistor structures and analogous structures are within the contemplated scope of the disclosure. the GAA transistor may be included in a microprocessor, memory cell, and/or other integrated circuit (IC).

At a first glance, devices 100, 100', and 100" assume the appearances of a multi-channel vertical gate-all around ("VGAA") device, a single channel vertical gate-all-around device, and a single channel horizontal gate-all-around ("HGAA") device, respectively. However, compared with conventional devices of similar structural outlooks (which generally rely on beam structures made of dopant-modified semiconductor materials as carrier channels), the device in accordance with the instant disclosure comprises a composite structure utilizing 2-D layered materials capable of enhanced channel performance.

FIG. 1A illustrates a perspective view of a semiconductor device 100 in accordance with one embodiment of the instant disclosure. Particularly, the exemplary device 100 adopts a 3-D structural arrangement of the multi-channel VGAA architecture. A vertical channel device such as this incorporates a novel design architecture, in which the source and drain regions of the device are arranged vertically with respect to the planar surface of the wafer/substrate. The channel structure of the transistor device extends substantially vertically, bridging between the source and the drain regions, defining a vertical channel direction. As the source, channel, and drain regions of the device are arranged in a vertical stack with respect to the planar surface of a substrate, the vertical channel architecture offers a significant reduction in horizontal profile.

The exemplary device 100 includes a pair of composite structures 102a on a surface of a substrate 101a as the channel structure of the device, each comprises an inner core strut 110a having a substantially vertically extending circular pillar profile. In some embodiments, the substrate 101a is a semiconductor bulk substrate selectively comprising, for example, Si, and Ge materials. In some embodiments, the substrate 101a comprises a silicon-on-insulator (SOI) structure, SiGe-on insulator (SiGeOI) or Ge on insulator (GeOI). In some embodiments, the substrate 101a may comprise a compound semiconductor including silicon carbide, gallium arsenide, gallium phosphide, indium phosphide, indium arsenide, and indium antimonide; an alloy semiconductor including SiGe, SiGeSn, GaAsP, AlInAs, AlGaAs, GaInAs, GaInP, and GaInAsP; other suitable materials; or combinations thereof.

An outer sleeve layer 120a comprising a suitable 2-D layered channel material is disposed on the inner core strut 110a, thereby creating composite structure 102a that extends substantially vertically. Suitable 2-D layered channel material may include layered transitional metal dichalcogenide (which has a general formula of $TX_2$, where T is usually a transition metal atom from group of IVB, VB, VIB of the periodic table, while X is one of sulfur, selenium, or tellurium) and 2-D topological insulator (such as Sb2Te3 (antimony telluride), Bi2Se3 (bismuth selenide) or Bi2Te3 (bismuth telluride) silicene, germanene, and stannene). In general, the inner core strut is made of a material having a band gap wider than that of the 2-D layered channel material. In some embodiments, the inner core strut 110a is made of insulating materials. Moreover, in some embodiments, the inner core strut 110a is made of the same material as the substrate 101a then may be covered by an insulating layer Device 100 further comprises a gate structure 130a horizontally surrounding and wrapping around a middle section (e.g., a channel portion) of the composite structure 102a to provide channel control. Furthermore, a pair of source/drain contacts 140a respectively sleeve at least a part of the end portions (i.e., the tip and the root sections) of the composite structure, enabling electrical connection to the source/drain regions (sleeved under the respective source/drain contacts 140a and therefore not directly visible in the figure) at the opposite ends of the channel portion (wrapped by the outer sleeve layer 120a and thus not directly visible) of the exemplary device 100.

The outer sleeve layer 120a transversely wraps around a lateral circumference of the inner core strut 110a. The vertical wrapping coverage of the outer sleeve layer 120a (e.g., the coverage with respect to the longitudinal axis of the inner core strut, along the channel direction) extends at least across a channel region (e.g., a middle portion of the device in contact with the gate structure 130a) of the device 100. Particularly, the outer sleeve layer 120a bridges between the vertically arranged source and drain regions of the exemplary device 100, providing a substantially vertical carrier conduction path. The GAA arrangement of the horizontally surrounding gate structure 130a enables more effective current control through the channel, thereby allowing the implantation of shorter gate nodes.

FIG. 1B illustrates a perspective view of a semiconductor device 100' in accordance with another embodiment of the instant disclosure. The exemplary device 100' also adopts a VGAA arrangement, yet employs a single vertical channel structure on a surface of a substrate 101b. The substrate 101b may share similar features as that of the previous example, therefore the detail thereof will be omitted for brevity.

Specifically, the exemplary device 100' comprises a single channel structure, which includes an inner core strut 110b having a long and narrow oval profile, extending substantially in a vertical direction (along the z-axis). An outer sleeve layer 120b comprising a suitable 2-D layered channel material is disposed on the inner core strut 110b, thereby creating a vertically extending composite structure 102b. Suitable 2-D layered channel material may include layered transitional metal dichalcogenide (which has a general formula of $TX_2$, where T is usually a transition metal atom from group of IVB, VB, VIB of the periodic table, while X is one of sulfur, selenium, or tellurium) and 2-D topological insulator (such as Sb2Te3 (antimony telluride), Bi2Se3 (bismuth selenide) or Bi2Te3 (bismuth telluride), silicene, germanene, and stannene). In some embodiments, the inner core strut 110a is made of insulating materials. Moreover, in some embodiments, the inner core strut 110a is made of the same material as the substrate 101b and is covered by a thin insulator.

Device 100' further comprises a horizontally surrounding gate structure 130b that wraps around a middle section of the composite structure 102b to provide channel control. Furthermore, a pair of source/drain contacts 140b respectively sleeve at least part of the end portions of the composite structure 102b, enabling electrical connection to a respective source/drain region (not directly visible in the figure) of the exemplary device 100'.

Similarly, the outer sleeve layer 120b transversely wraps around a lateral circumference of the inner core strut 110b. The vertical wrapping coverage of the outer sleeve layer 120b extends at least across a channel section (e.g., a middle portion of the device in contact with the gate structure 130b) of the device 100'. The outer sleeve layer 120b bridges between the vertically arranged source and drain regions (sleeved under the source/drain contacts 140b, thus not directly visible in the figure) of the exemplary device 100', providing a substantially vertical carrier conduction path. Particularly, a larger cross-sectional profile of the oval-shaped inner core strut 110b may require a larger lateral coverage of the outer sleeve layer 120b, which generally provides a wider conduction surface that would result in an increased on-current flow.

FIG. 1C illustrates a perspective view of a semiconductor device 100" in accordance with another embodiment of the instant disclosure. The exemplary device 100" adopts the HGAA arrangement with a single horizontal channel structure. Specifically, the exemplary device 100" comprises a single channel structure that includes a horizontally extending inner core strut 110c having a generally rectangular profile and an outer sleeve layer 120c comprising a suitable 2-D layered channel material. Suitable 2-D layered channel material may include layered transitional metal dichalcogenide (which has a general formula of $TX_2$, where T is usually a transition metal atom from group of IVB, VB, VIB of the periodic table, while X is one of sulfur, selenium, or tellurium) and 2-D topological insulator (such as Sb2Te3 (antimony telluride), Bi2Se3 (bismuth selenide) or Bi2Te3 (bismuth telluride), silicene, germanene, and stannene). The outer sleeve layer 120c wraps around the inner core strut 110c, yielding a composite structure 102c that extends substantially horizontally (e.g., along the x-axis). Device 100" further comprises a gate structure 130c that vertically surrounds and wraps around a middle section of the composite structure 102c to provide channel control. In some embodiments, the inner core strut 110c is made of insulating materials. Moreover, in some embodiments, the inner core strut 110c is made of the same material as the substrate 101c and is covered by a thin insulator.

Similarly, a pair of source/drain contacts 140c respectively sleeve at least part of the end portions (i.e., the respective lateral terminal sections) of the composite structure 102c, enabling electrical connection to the source/drain regions (sleeved under the source/drain contacts and are not directly visible in the figure) of the exemplary device 100".

The outer sleeve layer 120c wraps around a lateral circumference of the inner core strut 110c. The horizontal wrapping coverage of the outer sleeve layer 120c extends at least across a channel section (e.g., a middle portion of the device in contact with the gate structure 130c) of the device 100". Particularly, the outer sleeve layer 120c traverses between the horizontally arranged source and drain regions of the exemplary device 100", providing a substantially horizontal carrier conduction path.

Figure 2A:
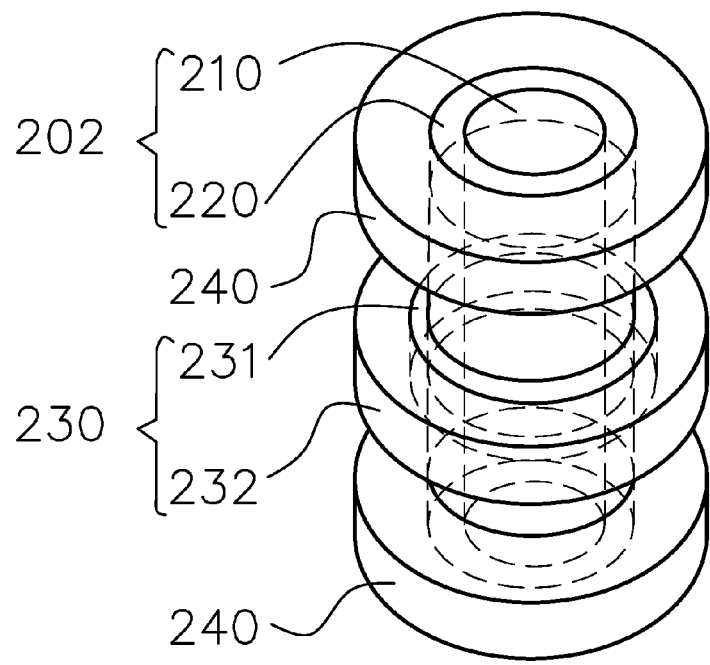
FIGS. 2A-D illustrate isometric and cross-sectional views of a portion of a semiconductor device in accordance with embodiments of the instant disclosure.
Figure 2B:
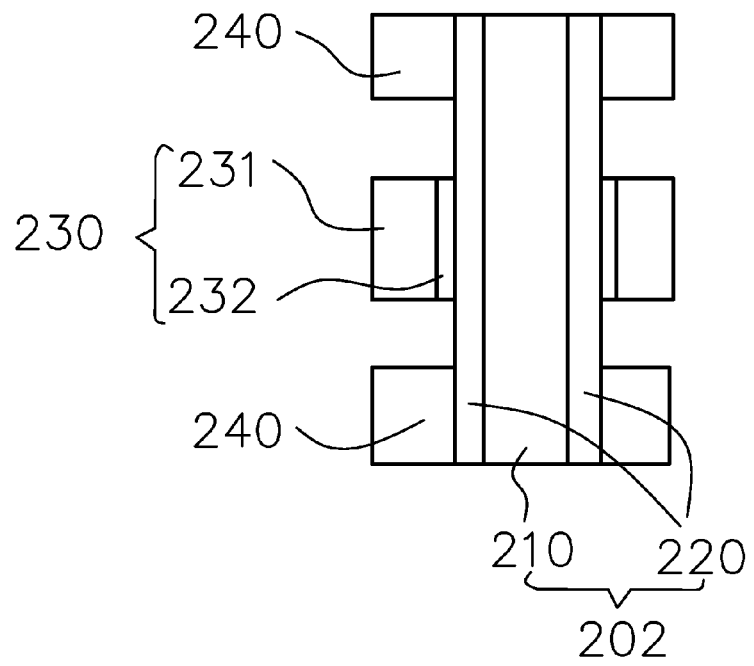

Referring concurrently to FIGS. 2A and 2B. FIG. 2A illustrates an isometric view of a portion of a semiconductor device in accordance with one embodiment of the instant disclosure, while FIG. 2B illustrates a cross-sectional view of the structure shown in FIG. 2A along a longitudinal geometric axial thereof. Together, FIGS. 2A and 2B provide a more detailed picture of an exemplary channel portion of a device in accordance with embodiments of the instant disclosure.

The channel portion of the exemplary device utilizes a composite structure 202, which comprises an inner core strut 210 and an outer sleeve layer 220. While the instant figure shows the composite structure 202 in a substantially vertical orientation, such arrangement is mainly for the convenience and clarity of illustration; the practical arrangement of the composite structure may be horizontal as well as vertical, depending on specific design requirements.

In the instant embodiment, the inner core strut 210 generally assumes a pillar profile with a substantially uniform cross-sectional shape of a circle. The outer sleeve layer 220 is disposed substantially conformally on the inner core strut 210 around a transverse periphery (e.g., the circular cross-sectional profile) thereof. Moreover, the longitudinal wrapping coverage of the outer sleeve layer 220 extends substantially across a full length of the inner core strut 210, reaching not only a central portion of the inner core strut 210 (which comprises a channel region of the device) but also the two respective end portions thereof (which respectively comprises a source/drain region).

The instant example illustrates the use of an ultra thin outer sleeve layer as a carrier channel. However, in some embodiments, multiple sleeve layers arranged in an alternating stack (e.g., with insulating layers arranged therebetween) may be applied to further enhance the on-state current flow.

The exemplary device further comprises a gate structure 230 that horizontally surrounds and wraps around a middle section (e.g., a channel portion) of the composite structure 202 to provide channel control. Furthermore, a pair of source/drain contacts 240 of collar structure respectively sleeves at least part of the composite structure 202 at the end portions thereof. The source/drain contact 240 electrically contacts the outer sleeve layer 220, enabling electrical connection to a respective source/drain region of the exemplary device.

In some embodiments, the inner core strut 210 is made of one or more insulating materials. In some embodiments, the inner core strut 210 is made of insulating materials including low-k interlayer dielectric materials. In some embodiments, the inner core strut 210 is made from the same material as the substrate one which it stands and is covered by a thin insulator. The outer sleeve layer 220 comprises one or more suitable 2-D layered channel material. Suitable 2-D layered channel material may include layered transitional metal dichalcogenide e, for example, molybdenum disulfide ($MoS_2$), molybdenum diselenide ($MoSe_2$), phosphorene (black phosphorus), phosphorene multilayers (blue phosphorus), tungsten disulfide ($WS_2$), tungsten diselenide ($WSe_2$), tungsten disulfide ($WS_2$), tungsten diselenide ($WSe_2$), and molybdenum ditelluride ($MoTe_2$), and 2-D topological insulator, such as Sb2Te3 (antimony telluride), Bi2Se3 (bismuth selenide) or Bi2Te3 (bismuth telluride), silicene, germanene, and stannene. Because the 2-D layered channel material of the outer sleeve layer 220 is generally thin and lacks mechanical strength to sustain a desirable shape, the underlying inner core strut 210 is implemented as a structural backbone to provide mechanical support for the thin and pliant outer sleeve layer 220.

The gate structure 230 may be a gate stack that comprises a gate dielectric layer 231 and a gate material layer 232. The gate dielectric layer 231 may comprise high-k dielectric materials, including, for example, oxides of Si, Ge, Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The gate dielectric layer may be formed using a suitable process such as atomic layer deposition (ALD), chemical vapor deposition (CVD), physical vapor deposition (PVD), thermal oxidation, UV-ozone oxidation, or combinations thereof. The gate material layer 232 may comprise a metal material such as Al, Cu, W, Ti, Ta, TiN, TiAl, TiAlN, TaN, TaC, TiC, NiSi, CoSi, other conductive materials with a compatible work function, or combinations thereof. The deposition of the gate material may be implemented using a suitable process such as ALD, CVD, PVD, plating, or combinations thereof.

The source/drain contact 240, while being shown in the instant figure as a circular ring collar, may also be a collar structure of other suitable shapes, arranged to at least partially sleeve a respective source/drain portion of the composite structure 202 at an end portion thereof. The source/drain contact 240 may be made of suitable conductive material(s) through suitable deposition technique(s) to enable electrical connection to the source/drain regions of the exemplary device.

Figure 2C:
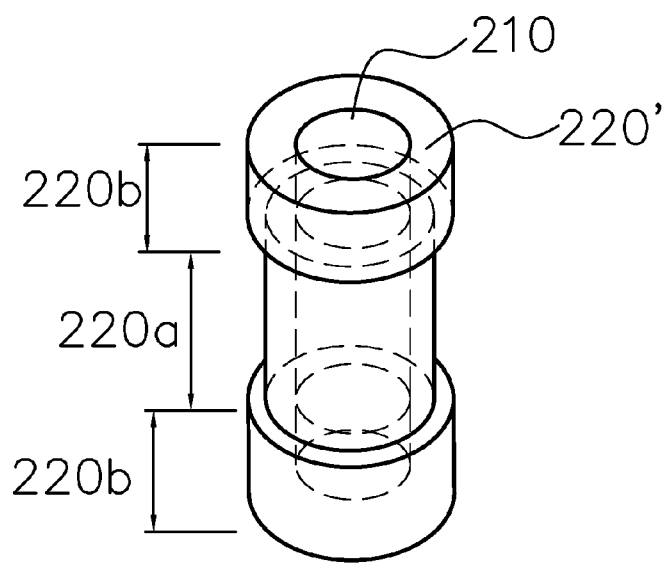
Figure 2D:
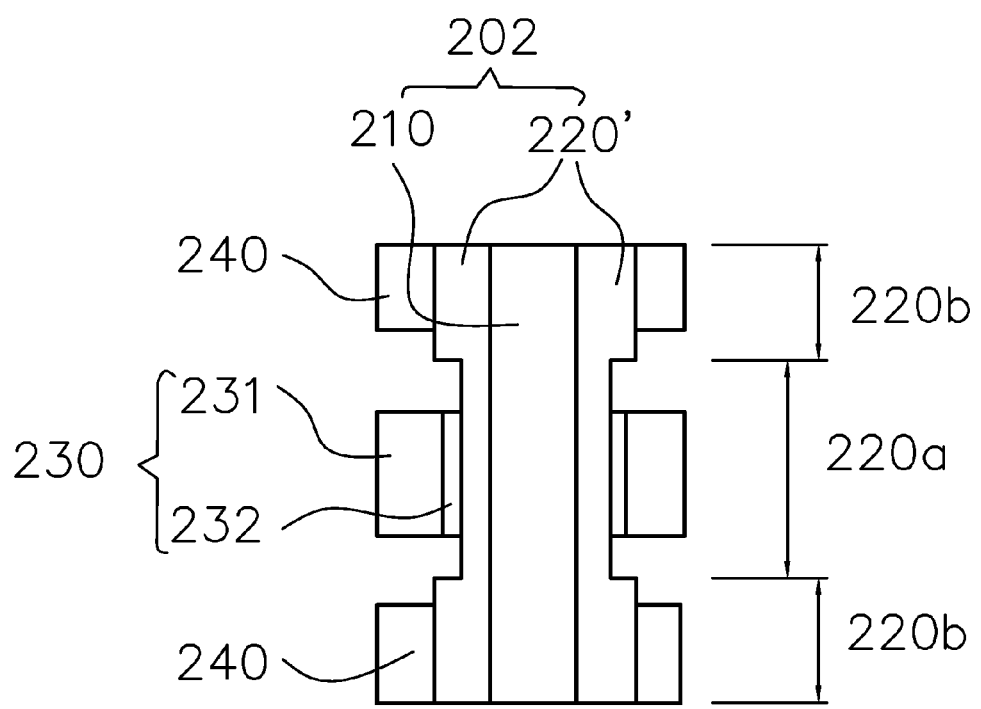

Referring to FIG. 2C. In some embodiments the sleeve material may be thicker in the source and drain regions than in the channel region, such that the sleeve material exhibits metallic conduction (topological insulator) in the source and drain regions and a semiconducting behavior in the channel region. As shown in FIG. 2C, the outer sleeve layer 220' comprises a middle section 220a (which defines a channel region) having a thinner profile, while the respective end sections 220b thereof (which respective defines a source/drain region) are of thicker profile. Accordingly, FIG. 2D illustrates a cross-sectional view of a structure that utilizes the channel arrangement of FIG. 2C, along a longitudinal geometric axial thereof. Because the general structural components of the instant example are similar to that delineated if the previous embodiment, the details thereof is omitted for brevity.

Figure 3A:
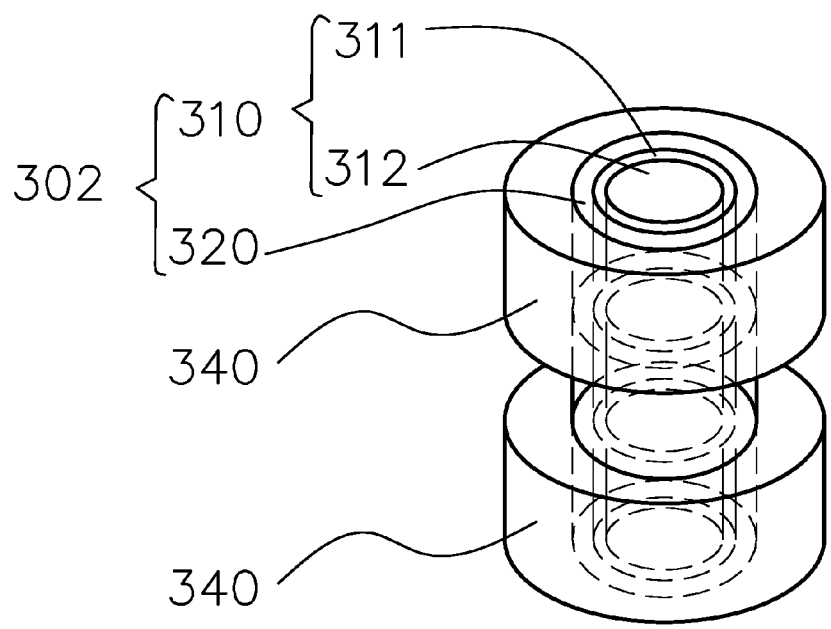
FIGS. 3A-B illustrate isometric and cross-sectional views of a portion of a semiconductor structure in accordance with embodiments of the instant disclosure.
Figure 3B:
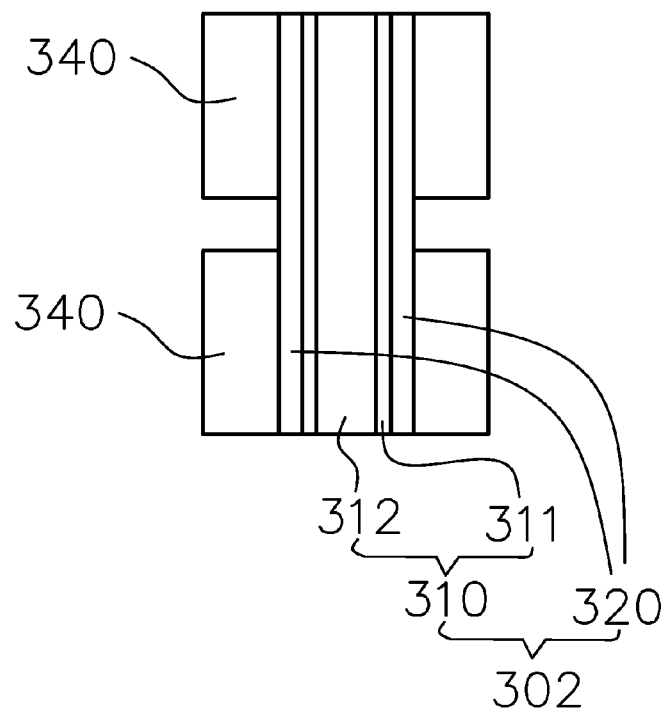

Referring to FIGS. 3A and 3B, FIG. 3A illustrates an isometric view of a portion of a semiconductor device in accordance with another embodiment of the instant disclosure, while FIG. 3B illustrates a cross-sectional view of the structure shown in FIG. 3A along a longitudinal geometric axial thereof.

In the instant embodiment, the exemplary device also includes a composite structure 302 that comprises an inner core strut 310 and an outer sleeve layer 320. While the instant figure shows the composite structure in a substantially vertical orientation, such arrangement is mainly for the convenience and clarity of illustration; the practical arrangement of the composite structure may be horizontal as well as vertical, depending on specific design requirements.

Similarly, the inner core strut 310 assumes a generally circular pillar profile. The outer sleeve layer 320 is disposed substantially conformally on the inner core strut 310 around a transverse periphery thereof. Moreover, the longitudinal wrapping coverage of the outer sleeve layer 320 extends substantially across the full length of the inner core strut 310, reaching not only the central portion of the inner core strut 310 (defining the channel region of the device) but also the two respective end portions thereof (defining the source/drain regions). While the instant example illustrates the use of an ultra thin sleeve layer as channel material, in some embodiments, multiple sleeve layers may be applied to further enhance the on-state current flow. Furthermore, a pair of source/drain contacts 340 respectively sleeves the outer sleeve layer 320 at the end portions of the composite structure 302, enabling electrical connection to a source/drain regions of the exemplary device.

The outer sleeve layer 320 comprises a suitable 2-D layered channel material, which may include layered transitional metal dichalcogenide, for example, molybdenum disulfide ($MoS_2$), molybdenum diselenide ($MoSe_2$), phosphorene (black phosphorus), phosphorene multilayers (blue phosphorus), tungsten disulfide ($WS_2$), tungsten diselenide ($WSe_2$), tungsten disulfide ($WS_2$), tungsten diselenide ($WSe_2$), and molybdenum ditelluride ($MoTe_2$), and 2-D topological insulator, such as Sb2Te3 (antimony telluride), Bi2Se3 (bismuth selenide) or Bi2Te3 (bismuth telluride), silicene, germanene, and stannene. Because the 2-D layered channel material of the outer sleeve layer 320 is generally thin and lacks mechanical strength to sustain a desirable shape, the underlying inner core strut 310 is implemented as a structural backbone to provide mechanical support for the thin and pliant channel material of the outer sleeve layer 320.

However, instead of having an inner strut made of an insulator, the inner core strut 310 of the instant embodiment also serves as an inner core gate stack that includes a gate dielectric layer 311 and a gate material layer 312.

Particularly, unlike most of the conventional device arrangements, this unique core gate stack configuration enables control of channel action from within the channel structure. Specifically, this arrangement not only provides a wide all-around control surface/area between the enclosed gate and the sleeving channel layer, thus enabling the gate structure to exert effective influence over the carrier channel, it also replaces the space-consuming external gate stack of the conventional design, thus significantly reducing the spatial requirement for the semiconductor device. Accordingly, the instant embodiment provides a core gate/channel all-around device architecture.

The inner core strut/core gate structure 310 may comprise a gate stack that includes a gate dielectric layer 311 and a gate material layer 312 (as shown in FIG. 3B). The gate dielectric layer 311 may comprise high-K dielectric materials, including, for example, oxides of Si, Ge, Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The gate dielectric layer may be formed using a suitable process such as atomic layer deposition (ALD), chemical vapor deposition (CVD), physical vapor deposition (PVD), thermal oxidation, UV-ozone oxidation, or combinations thereof. The gate material layer 312 may comprise a metal material such as Al, Cu, W, Ti, Ta, TiN, TiAl, TiAlN, TaN, TaC, TiC, NiSi, CoSi, other conductive materials with a compatible work function, or combinations thereof. The deposition of the gate material may be implemented using a suitable process such as ALD, CVD, PVD, plating, or combinations thereof.

The source/drain contact 340, while being shown in the instant figure as a circular ring collar structure, may be a structure of other suitable shapes, arranged to establish electrical connection with a respective source/drain portion toward an end portion of the composite structure 302. The source/drain contact 340 may be made of suitable conductive material(s) through suitable deposition technique(s) to enable electrical connection to the source/drain regions of the exemplary device. Thanks to the absence of an external gate, a shorter distance between the opposing source/drain contacts 340 may be achieved, yielding a more compact device profile.

In some embodiments the sleeve material may be thicker in the source and drain regions than in the channel region, such that the sleeve material exhibits metallic conduction (topological insulator) in the source and drain regions and a semiconducting behavior in the channel region, in a similar fashion as shown in FIG. 2C/2D.

Figure 4A:
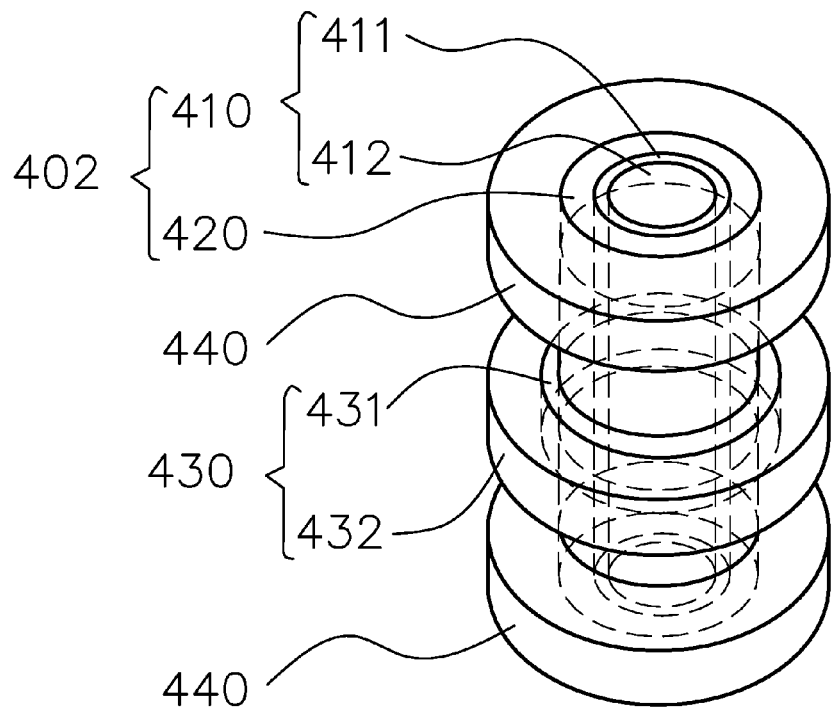
FIGS. 4A-B illustrate isometric and cross-sectional views of a portion of a semiconductor structure in accordance with embodiments of the instant disclosure.
Figure 4B:
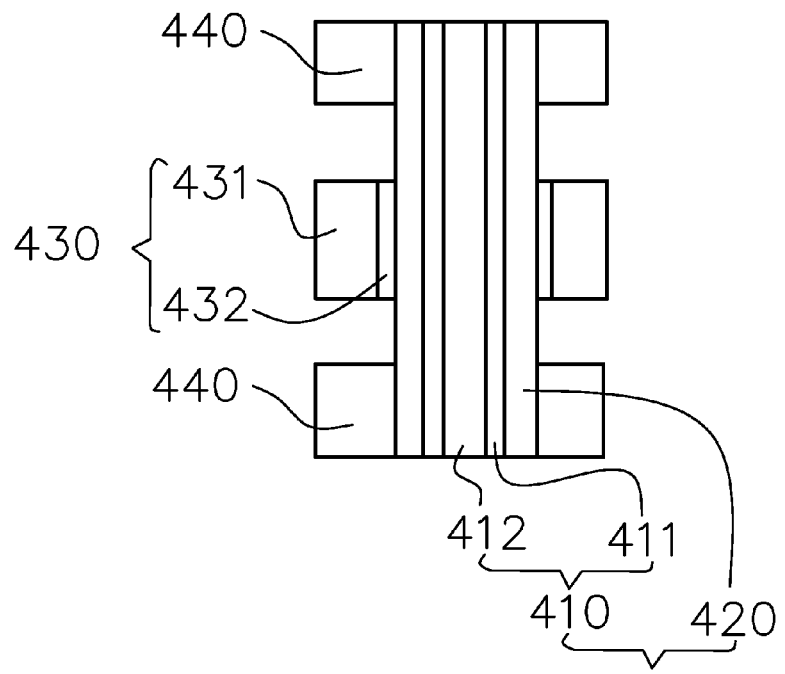

Referring to FIGS. 4A and 4B, FIG. 4A illustrates an isometric view of a portion of a semiconductor device in accordance with another embodiment of the instant disclosure, while FIG. 4B illustrates a cross-sectional view of the structure shown in FIG. 4A along a longitudinal geometric axial thereof.

The channel portion of the exemplary device employs a double gate configuration, which includes a composite structure 402 comprising an inner core strut/core gate stack 410 and an outer sleeve layer 420, as well as an external all-around gate 430. Such a multi-gate arrangement may be utilized to perform logical operations, such as a NAND logic gate. While the instant figure shows the composite structure in a substantially vertical orientation, such arrangement is mainly for the convenience and clarity of illustration; the practical arrangement of the composite structure may be horizontal as well as vertical, depending on specific design requirements.

The inner core strut 410 of the instant embodiment likewise assumes a generally circular pillar profile. The outer sleeve layer 420 is disposed substantially conformally on the inner core strut 410 around a transverse periphery thereof. The longitudinal wrapping coverage of the outer sleeve layer 420 extends substantially across a full length of the inner core strut 410, reaching not only a central portion of the inner core strut 410 (which comprises a channel region of the device) but also the two respective end portions thereof (which respectively comprises a source/drain region).

The outer sleeve layer 420 may comprise a suitable 2-D layered channel material, such as layered transitional metal dichalcogenide, for example, (molybdenum disulfide ($MoS_2$), molybdenum diselenide ($MoSe_2$), phosphorene (black phosphorus), phosphorene multilayers (blue phosphorus), tungsten disulfide ($WS_2$), tungsten diselenide ($WSe_2$), tungsten disulfide ($WS_2$), tungsten diselenide ($WSe_2$), and molybdenum ditelluride ($MoTe_2$), and 2-D topological insulator, such as Sb2Te3 (antimony telluride), Bi2Se3 (bismuth selenide) or Bi2Te3 (bismuth telluride), silicene, germanene, and stannene.

The inner core strut 410, which provides mechanical support as well as channel control for the outer sleeve layer 420, may comprise a gate stack that includes a gate dielectric layer 411 and a gate material layer 412. Likewise, the external gate structure 430 may comprise a gate stack that includes a gate dielectric layer 431 and a gate material layer 432.

The gate dielectric layer 411/431 may comprise high-K dielectric materials, including, for example, oxides of Si, Ge, Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The gate dielectric layer may be formed using a suitable process such as atomic layer deposition (ALD), chemical vapor deposition (CVD), physical vapor deposition (PVD), thermal oxidation, UV-ozone oxidation, or combinations thereof. The gate material layer 412/432 may comprise a metal material such as Al, Cu, W, Ti, Ta, TiN, TiAl, TiAlN, TaN, Tac, TiC, NiSi, CoSi, other conductive materials with a compatible work function, or combinations thereof. The deposition of the gate material may be implemented using a suitable process such as ALD, CVD, PVD, plating, or combinations thereof.

In addition, a pair of source/drain contacts 440 respectively collars on the outer sleeve layer 420 toward the end portions of the composite structure 402, enabling electrical connection to a respective source/drain region of the device. The source/drain contact 440, while being shown in the instant figure as a circular ring, may nevertheless be a structure of other suitable shapes, arranged to sleeve at least part of an end portion of the composite structure 402. The source/drain contact 440 may be made of suitable conductive material(s) through suitable deposition technique(s) for enabling electrical connection to a respective source/drain region of the exemplary device.

In some embodiments the sleeve material may be thicker in the source and drain regions than in the channel region, such that the sleeve material exhibits metallic conduction (topological insulator) in the source and drain regions and a semiconducting behavior in the channel region, in a similar fashion as shown in FIG. 2C/2D.

Figure 5A:
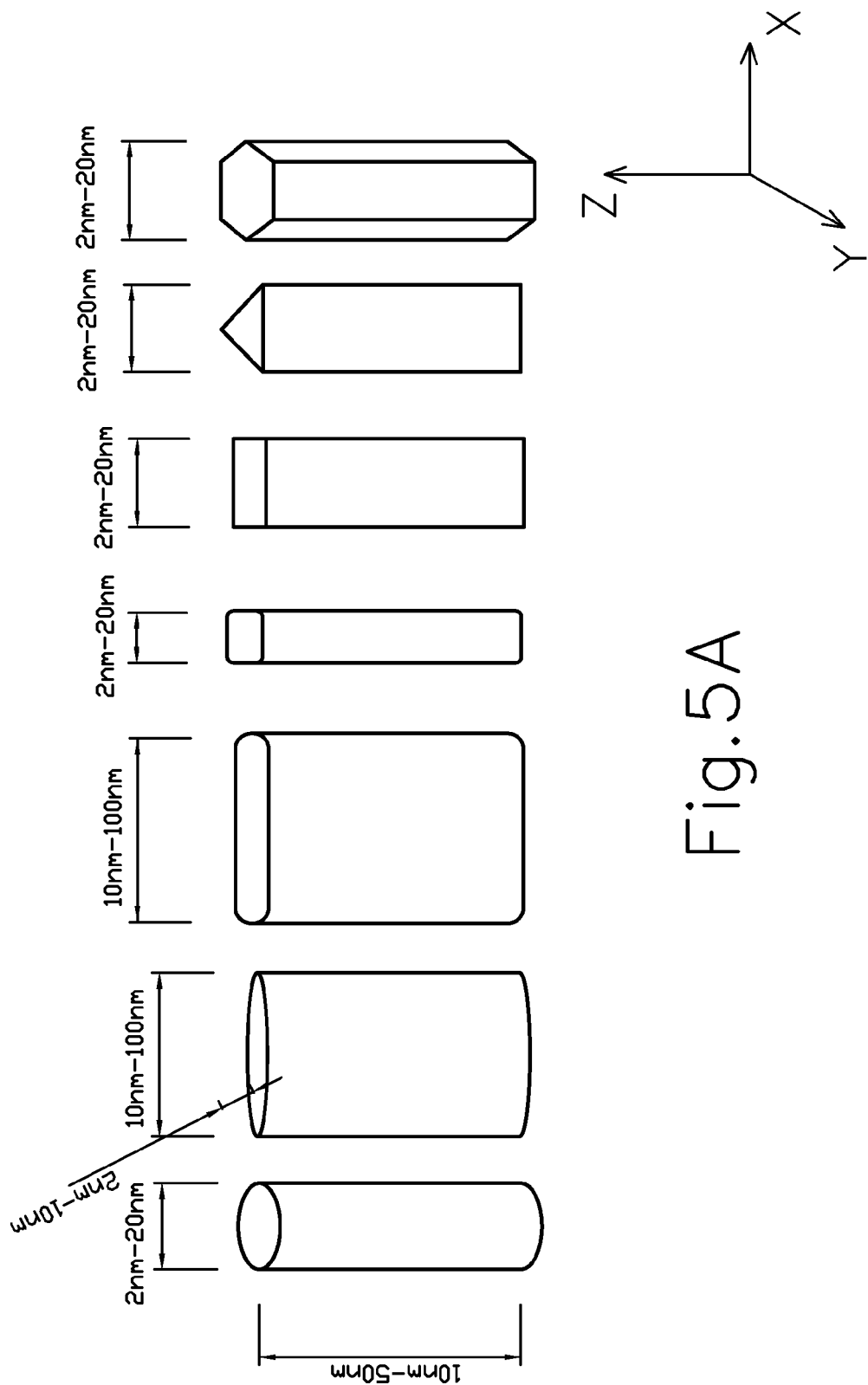
FIGS. 5A-B illustrate isometric views of a portion of a semiconductor device in accordance with various embodiments of the instant disclosure.
Figure 5B:
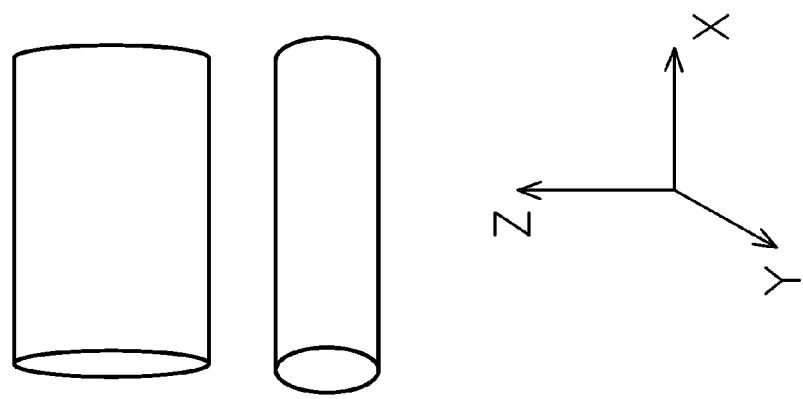
Figure 5B:
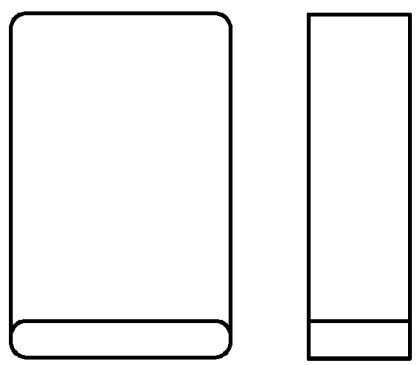
Figure 5B:
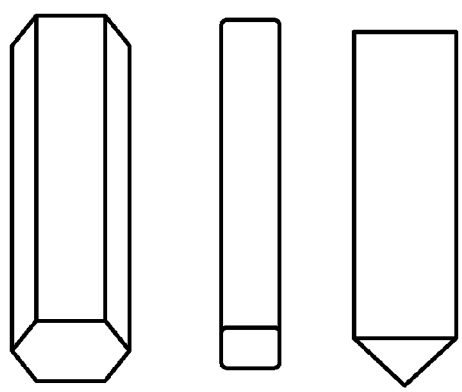

FIGS. 5A-B illustrate isometric views of a portion of a semiconductor device in accordance with various embodiments of the instant disclosure. Specifically, FIGS. 5A and 5B illustrate exemplary shapes and orientations of the composite structure of a device in accordance with embodiments of the instant disclosure. For a vertical device architecture, a composite structure thereof (or rather, the inner core strut thereof) may be an elongated column/pillar structure having a substantially uniform cross-sectional profile, arranged in a substantially vertical fashion (e.g., along the z-axis) with respect to a planar surface of a substrate (as shown in FIG. 5A). Likewise, for a horizontal device arrangement, a composite structure thereof may be an elongated beam structure having a substantially uniform cross-sectional profile, arranged in a substantially horizontal fashion (e.g., along the x-axis) with respect to a planar surface of a substrate (as illustrated in FIG. 5B). In some embodiments, a cross-sectional profile of the channel structure comprises a dimension as shown in FIG. 5A, e.g., having a cross-sectional width ranging from about 2 to about 100 nm. In some embodiments, a length of the composite structure (or the core strut) is in the range from about 10 to about 50 nm.

FIGS. 6A-D illustrate isometric views of a portion of a semiconductor device in accordance with various embodiments of the instant disclosure. Specifically, FIG. 6A-6D illustrate exemplary structural arrangements of a outer sleeve layer in accordance with various embodiments of the instant disclosure.

Referring to FIG. 6A, for a composite structure utilizing a sleeve layer that comprises direct band gap 2-D layered materials (for instance, TMDs), the composite structure (such as structure 602a) may adopt a fully sleeving, peripherally enclosing outer sleeve layer 620 around an inner core strut 610. For the simplicity of illustration, the exemplary inner core strut 610 assumes a generally circular pillar profile.

Specifically, the exemplary outer sleeve layer 620 is disposed substantially conformally on the inner core strut 610 around a transverse periphery thereof. The longitudinal wrapping coverage of the outer sleeve layer 620, in this example, extends substantially across the full length of the core strut 610, reaching not only the central portion of the core strut 610 (defining a channel region of the device) but also the two respective end portions thereof (respectively defining a source/drain region).

Utilizing the unique property of the 2-D layered channel materials, a conduction channel constituted there-by (e.g., defined at a middle portion of the thin layered structure) may exhibit none-zero band gap/semi-conductive properties, and thus can be turned on by applying a suitable gate voltage. On the other hand, an outer surface of the 2-D layered channel materials (e.g., at a tip/root portion of the composite structure 602a, which respectively defines a source/drain of the device) remains metallic/conductive. Therefore, a source/drain doping process as required by a conventional device will no longer be necessary. Accordingly, a source/drain contact (such as a contact of collar structure as shown in previous examples) may be disposed directly on the sleeve layer to establish electrical connection with the underlying source/drain region.

Referring to FIGS. 6B-6C, for a composite structure utilizing a sleeve layer comprising 2-D topological insulator materials whose behavior resemble that of an insulator in the interior yet exhibit (super)conductivity at an edge portion thereof (e.g., stannene), the composite structure (such as structure 602b/602c/602d) may adopt a partially sleeving, longitudinally extending outer sleeve layer 620'/620"/620'" on the inner core strut 610, leaving at least one edge 620a'/620a"/620a'" traversing across a channel length (e.g., a middle portion) of the device.

For instance, FIG. 6B shows an exemplary outer sleeve layer 620' having an overall width that is just short of fully encircling the circumference of the substantially circular cross-sectional profile of the inner core strut 610. This partial sleeving arrangement leaves at least a longitudinally extending open edge 620a' across at least a middle section of the composite structure 602b. A contact of collar structure (as discussed in previous examples) may then be disposed over the outer sleeve layer 620' at a respective end portion of the composite structure 602b to enable electrical connection to an underlying source/drain region.

FIG. 6C shows an exemplary outer sleeve layer 620" taking the form of separated, longitudinally extending strips around the circumference of the cross-sectional profile of the inner core strut 610. This partial sleeving arrangement provides a plurality of longitudinally extending open edges 620a" across at least a middle section of the composite structure 602c, creating multiple conduction paths there along.

FIG. 6D shows an exemplary outer sleeve layer 620'" having a "window" (e.g., longitudinal slit) disposed at a central portion thereof, thereby creating a (pair of) longitudinally extending closed edge 620'" along the channel direction of the composite structure 602d.

While the edge 620a'/620a"/620a'" is shown to extend substantially along the axial direction of the core strut 610 (e.g., along the z-axis), the practical direction of extension thereof does not have to be so; other angles of extension may be adopted (the edge may even be a non-straight line), as long as the edge 620a'/620a"/620a'" traverses across a channel region of the composite structure, e.g., from a source region to a drain region.

Accordingly, the (super)conductive property of the longitudinally extending edge 620a'/620a"/620a'" of a topological insulator may be utilized to create an effective carrier channel, allowing transportation of charge carriers from the source to the drain region of the device (or vice versa) when the channel is turned on.

FIGS. 7A-H illustrate isometric and cross-sectional views of a portion of a semiconductor device at various stages of fabrication in accordance with embodiments of the instant disclosure. Specifically, an exemplary fabrication process of a channel structure in accordance with one embodiment of the instant disclosure is provided for illustration.

Figure 7A:
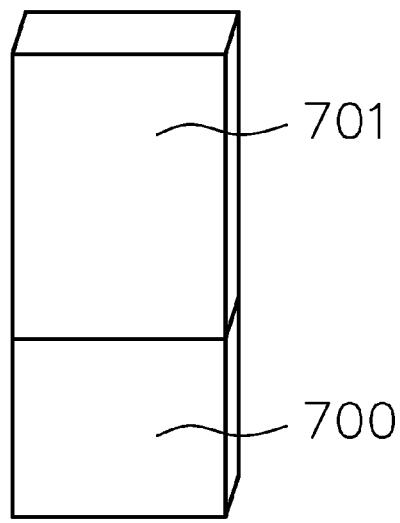
FIGS. 7A-I illustrate isometric and cross-sectional views of a portion of a semiconductor device at various stages of fabrication in accordance with embodiments of the instant disclosure.

Referring to FIG. 7A, which shows an isometric view of a channel portion of a semiconductor device at a dielectric deposition stage of fabrication in accordance with one embodiment of the instant disclosure. Specifically, a dielectric material 701 (e.g., an interlayer dielectric/ILD) is disposed on a substrate 700. The dielectric material is formed with a proper thickness (e.g., from about 10 to about 50 nm) for a subsequent core strut formation process. The slightly tilted angle of the isometric view is utilized to better illustrate a cross-sectional profile of a subsequently formed core strut. In some embodiments, however, a core strut may be made from the same material as the substrate 700, and may be covered by a thin insulator. In that case, a hard mask and a suitable directional etching combination may be used to define a vertical core strut on the substrate 700.

Figure 7B:
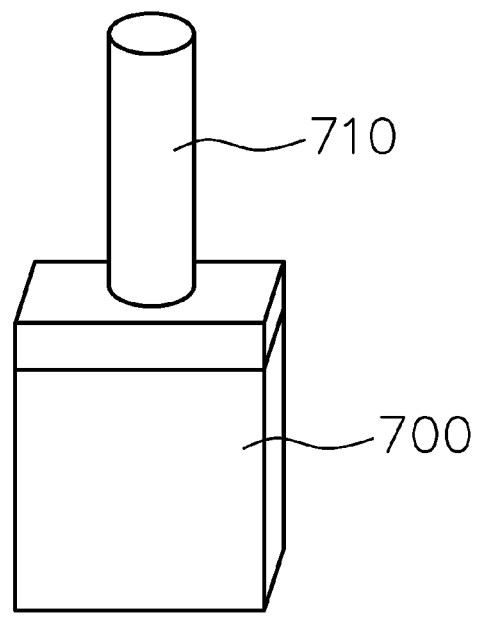

Referring to FIG. 7B, which shows an isometric view of a channel portion of a semiconductor device at a core strut formation stage of fabrication in accordance with one embodiment of the instant disclosure. Specifically, an etch mask of a predetermined shape (not shown in the figure) may be disposed on the top surface of the dielectric layer to define a particular cross-sectional profile of an inner core strut. A suitable etching process (e.g., an anisotropic/directional etch) is performed to recess the un-masked area of the dielectric layer down to a predetermined depth, thereby generating an inner core strut 710 that extends substantially vertically with a predetermined height. In some embodiments, the un-masked portion of the dielectric material may be fully removed, leaving only the inner core strut 710 standing on a top surface of the substrate 700. For the simplicity of illustration, the exemplary core strut 710 assumes a substantially circular cross-sectional profile, similar to that shown in previous examples. Of course, cross-section of other shapes may be adopted depending on specific design requirements and operational needs.

Figure 7C:
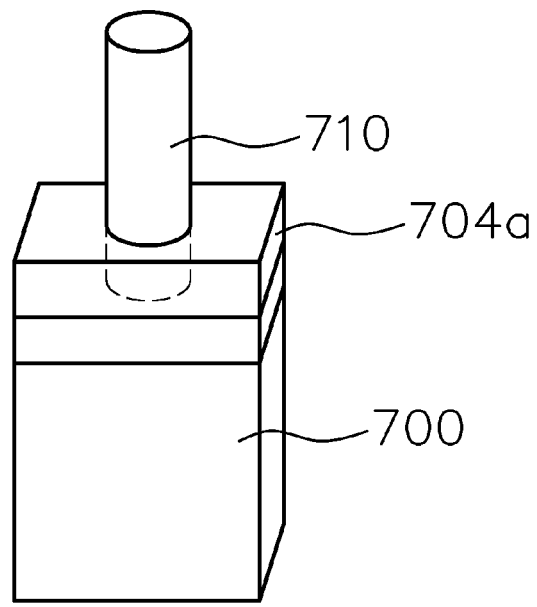
Figure 7D:
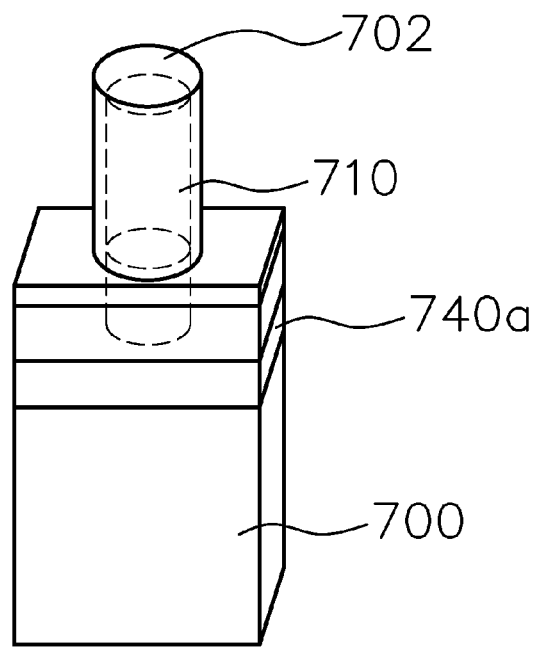

Referring to FIG. 7C, which shows an isometric view of a channel portion of a semiconductor device at a contact layer deposition stage of fabrication in accordance with one embodiment of the instant disclosure. Specifically, a conductive layer 704a is disposed at the root portion of the core strut 710. The conductive layer 704a may include suitable metal materials, and is subsequently etched back and planarized to define a first source/drain contact 740a (as shown in FIG. 7D) at a root portion of the inner core strut 710. The first source/drain contact 710 further processed to produce a desirable contact profile.

Referring to FIG. 7D, which shows an isometric view of a channel portion of a semiconductor device at a 2-D layered channel material deposition stage of fabrication in accordance with one embodiment of the instant disclosure. Specifically, a 2-D channel layer 702 of 2-D layered channel material is disposed over the inner core strut 710, as well as on the first source/drain contact 740a at the root portion of the inner core strut 710. The 2-D channel layer 702 will subsequently be processed to define a sleeve layer 720 (as shown in FIG. 7I) that wraps around the periphery of the core strut 710.

The provision of the 2-D channel layer 702 may include micromechanical/chemical/liquid exfoliation, physical vapor deposition (PVD), hydrothermal synthesis, precursor thermolysis, epitaxy/molecular beam epitaxy (MBE), atomic layer deposition (ALD), chemical vapor deposition (CVD), Langmuir-Blodgett deposition, and a suitable combination thereof. In some embodiments, surface treatment is provided on the exposed surface of the core strut 710 prior to the deposition of the 2-D layered channel material, conditioning the core strut 710 for better adherence with the 2-D channel layer 702. In some embodiments, a thin interfacial layer is provided on the surface of the core strut 710 prior to the deposition of the 2-D channel layer 702 to enhance adherence there-between. Moreover, in some embodiments, surface deposition or treatment of the core strut 710 is performed to passive or increase the stability of the 2-D layered channel material.

On the other hand, the surface contact between the 2-D channel layer 702 and the first source/drain contact 740a establishes electrical connection there-between, thus enabling passage of the charge carriers there-between when the channel is turned on.

Figure 7E:
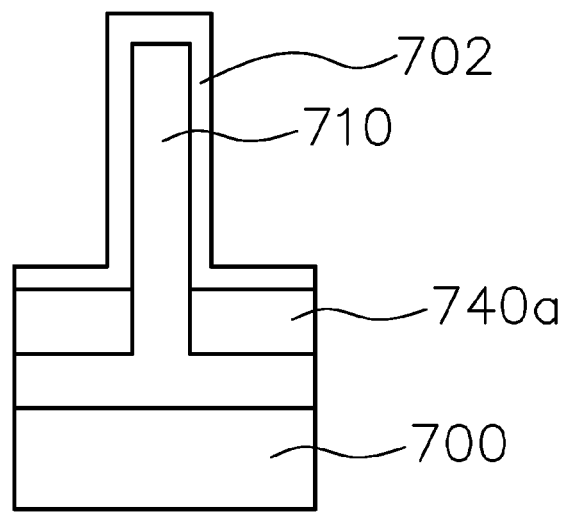

Referring to FIG. 7E, which shows a cross-sectional view of a channel portion of a semiconductor device at the 2-D layered channel material deposition stage of fabrication as shown in FIG. 7D. For the simplicity and clarity of illustration, cross-sectional views of the channel structure along the longitudinal axis (e.g., the z-axis) will be used for the proceeding discussion.

Particularly, the cross-sectional view of FIG. 7E shows that the exemplary fabrication process produces an outer sleeve layer 720 whose longitudinal wrapping coverage does not span across a full length (height) of the inner core strut 710. Specifically, in this embodiment, the root portion of the inner core strut 710 is encircled by the contact layer 740a instead of the 2-D sleeve channel layer 702. Nevertheless, a full-length spanning sleeve layer (as shown in the previous examples) may be obtained by slightly adjusting the order of fabrication process (e.g., perform the 2-D layer deposition process prior to the contact formation process).

Figure 7F:
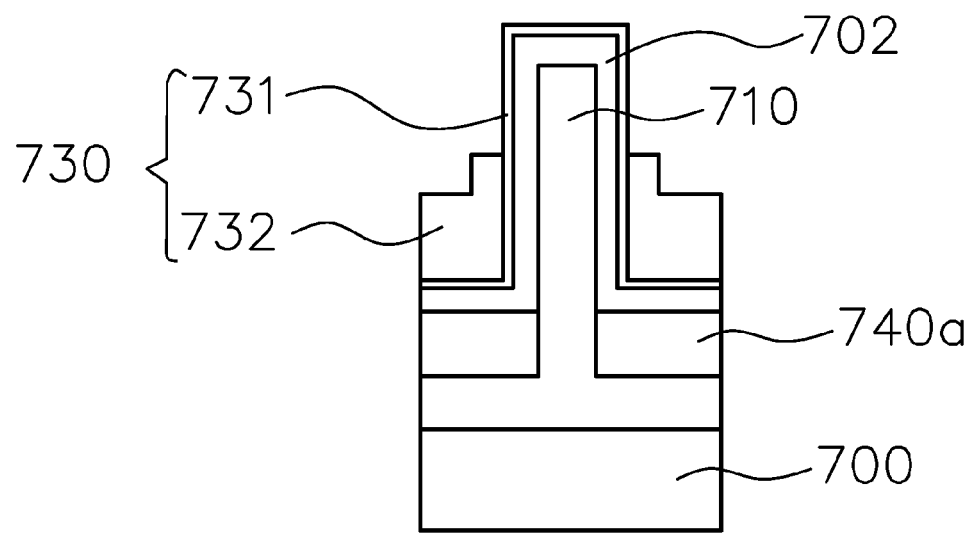

Referring to FIG. 7F, which shows a cross-sectional view of a channel portion of a semiconductor device at a gate stack deposition stage of fabrication in accordance with one embodiment of the instant disclosure. Specifically, a gate dielectric layer 731 is disposed on the 2-D channel layer 710, covering at least the middle channel portion of the composite structure (which comprises the inner core strut 710 and outer sleeve layer 720). A gate material layer 732 is then disposed on the gate dielectric layer 731 to a predetermined height (which determines a gate node length of the device). The gate material layer 732 and the gate dielectric layer 731 therefore encircle a middle (channel) portion defined on the 2-D channel layer 702, forming an all-around gate stack structure 730. The gate stack structure 730 may be etched back and planarized to produce a desirable gate stack profile. Suitable choice of materials for the gate stack structure may be comparable to that discussed previous, and is therefore not repeated for brevity.

Figure 7G:
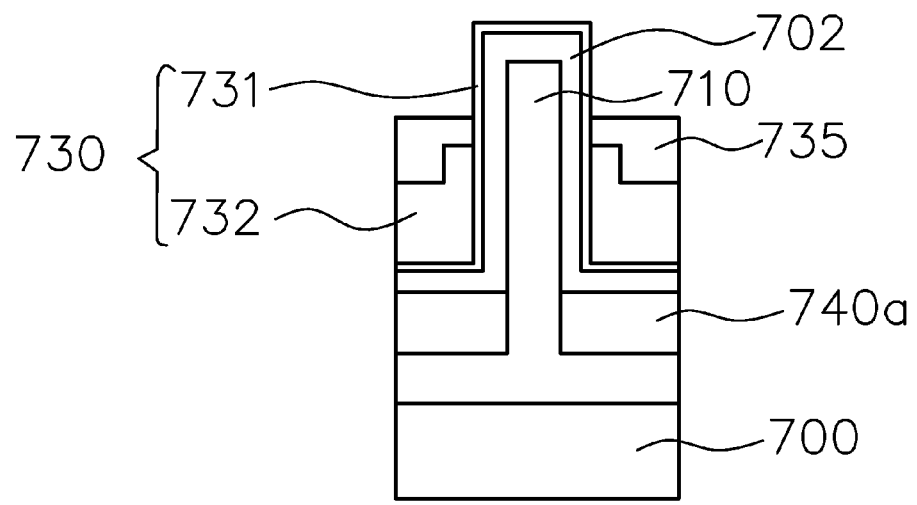

Referring to FIG. 7G, which shows a cross-sectional view of a channel portion of a semiconductor device at a dielectric deposition stage of fabrication in accordance with one embodiment of the instant disclosure. Specifically, an interlayer dielectric (ILD) layer 735 is disposed on the gate material layer 732. Particularly, the exemplary ILD layer 735 reaches a height above the conductive gate material layer 732 and contacts the gate dielectric layer 731 on the peripheral surface of the composite structure. The ILD layer 735 may be planarized and etched back to generate a desirable profile, forming an insulating structure that prevents shorting between the gate stack and a subsequently disposed source/drain contact.

Figure 7H:
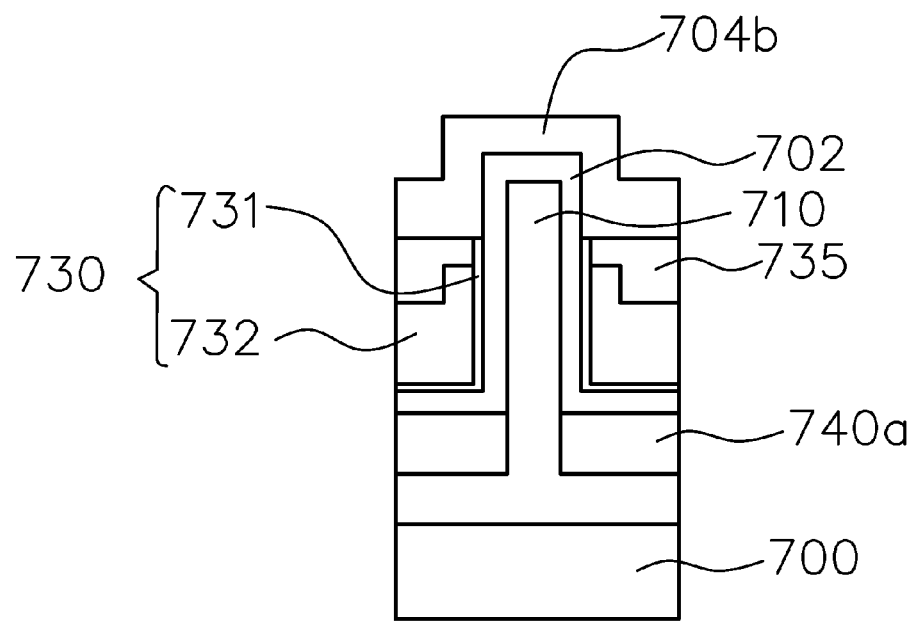
Figure 7I:
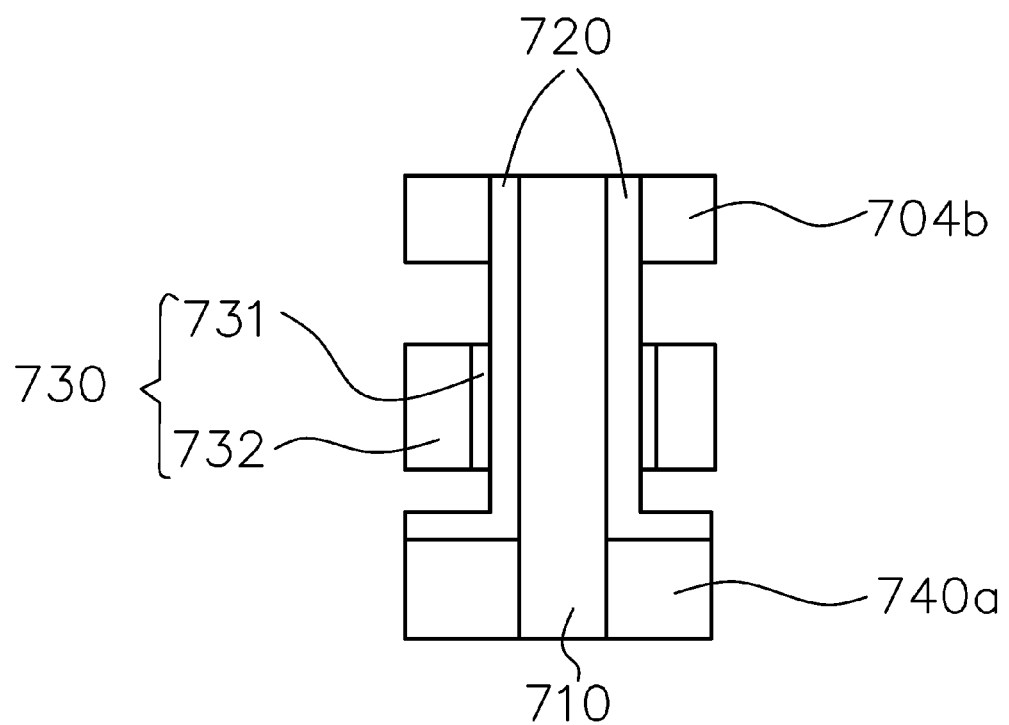

Referring to FIG. 7H, which shows a cross-sectional view of a channel portion of a semiconductor device at a second contact layer deposition stage of fabrication in accordance with one embodiment of the instant disclosure. Specifically, portions of the gate dielectric layer 731 above the planarized surface of the ILD layer 735 are removed. Furthermore, the gate dielectric layer 731 on the 2-D channel layer 702 is recessed to be substantially flush with the planarized surface of the ILD layer 735. A second conductive layer 704b is then disposed on the planarized surface of the ILD layer 735, as well as over the outer sleeve layer 720. The contact layer 740b may include suitable metal materials subsequently processed to define a second source/drain contact 740b (as shown in FIG. 7I).

Referring to FIG. 7I, which shows a cross-sectional view of a channel portion of a semiconductor device at a finalizing stage of fabrication in accordance with one embodiment of the instant disclosure. For the simplicity of illustration, certain features (e.g., the interlayer dielectric layer 735) have been omitted from the figure, therefore providing a comparable view of the structural arrangement similar to that shown in the previous examples. Specifically, the conductive/contact layer 704b is etched back and planarized to expose a top surface of the inner core strut 710, forming the second source/drain contact 740b.

The exemplary device comprises a composite structure having an inner core strut 710 that provides mechanical support for the outer sleeve layer 720 wrapped thereon. The outer sleeve layer 720, while not extends fully across the entire length of the inner core strut 710 in this example, nevertheless spans across a middle (channel) portion of the semiconductor device. Moreover, a surrounding gate stack structure 730 is disposed around the middle portion of the composite structure, encircling the channel portion thereof to provide all-around channel control. Furthermore, the outer sleeve layer 720 respectively contacts the first source/drain contact 740a at the root portion of the composite structure and the second contact collar 740b at the tip portion thereof, enabling establishment of electrical connection to the source/drain regions of the semiconductor device.

By utilizing the rich physical properties of the 2-D layered channel materials, electronic devices with high on-off current ratio and good electrical performance may be obtained. Particularly, the implementation of suitable 2-D layered channel materials in 3-D device architectures may yield further scaled, high-performance low-power devices adaptable for aggressive (e.g., sub 20 nm) gate lengths. Furthermore, vertical devices that utilize the composite structure may provide the basis for a stackable, self-insulated monolithic 3-D integrated circuit (3DIC), enabling even higher degrees of device integration.

Accordingly, one aspect of the instant disclosure provides a semiconductor device, which comprises a channel structure that includes an inner core strut that extends substantially along a channel direction of the semiconductor device and an outer sleeve layer disposed on the inner core strut.

The inner core strut mechanically supports the sleeve member across a channel length of the semiconductor device.

Accordingly, another aspect of the instant disclosure provides a semiconductor device, which comprises: a composite structure that includes an inner core strut extending substantially along a channel direction of the semiconductor device, and an outer sleeve layer disposed on the inner core strut. The inner core strut mechanically supports the sleeve member across a channel length of the semiconductor device. Moreover, a central portion of the outer sleeve layer traverses across the channel length of the semiconductor device and defines a channel region thereof. Furthermore, a pair of opposing end portions of the outer sleeve layer respectively define a source and a drain region of the semiconductor device.

Accordingly, another aspect of the instant disclosure provides a semiconductor device that comprises: a composite structure that includes an inner core strut extending substantially along a channel direction of the semiconductor device and an outer sleeve layer disposed on the inner core strut, and an all-around gate structure disposed on the outer sleeve layer at the channel region. The inner core strut mechanically supports the sleeve member across a channel length of the semiconductor device. Moreover, a longitudinal coverage of the outer sleeve layer at least extends across the channel length of the semiconductor device and defines a channel region thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a composite structure that comprises
      an inner core strut that comprises a gate stack; and
      an outer sleeve layer that is sleeved on the gate stack of the inner core strut and that comprises a two-dimensional (2-D) layered material, wherein the inner core strut mechanically supports the outer sleeve layer and wherein the outer sleeve layer has a central portion that defines a channel region and a pair of opposing end portions that respectively define source and drain regions.

2. The device of claim 1, wherein the inner core strut defines a substantially uniform cross-sectional profile; wherein the outer sleeve layer substantially conformally wraps on the inner core strut; wherein the outer sleeve layer comprises one of a monolayer structure and a multilayer structure.

3. The device of claim 1, wherein the outer sleeve layer fully wraps around the inner core strut.

4. The device claim 1, wherein the outer sleeve layer partially wraps around the inner core strut and has an edge traversing along a channel length of the channel region thereof.

5. The device of claim 1, wherein the outer sleeve layer further comprises a 2-D topological insulator material.

6. The device of claim 1, further comprising a substrate having a planar surface, wherein the gate stack is substantially perpendicular with respect to the planar surface of the substrate.

7. The device of claim 1, wherein the gate stack comprises a metal gate material and a high-k gate dielectric.

8. The device of claim 1, further comprising a substrate having a planar surface, wherein the gate stack is substantially parallel with respect to the planar surface of the substrate.

9. The device of claim 8, wherein the gate stack comprises a metal gate material and a high-k gate dielectric.

10. A semiconductor device, comprising:
    a composite structure that comprises
       an inner core strut that comprises a gate stack; and
       an outer sleeve layer that is sleeved on the gate stack of the inner core strut, wherein the inner core strut mechanically supports the outer sleeve layer; wherein a central portion of the outer sleeve layer defines a channel region; wherein a pair of opposing end portions of the outer sleeve layer respectively define source and drain regions.

11. The device of claim 10, wherein the central portion of the outer sleeve layer is thinner than the opposing end portions thereof.

12. The device of claim 10, further comprising a gate structure disposed on the outer sleeve layer at the channel region.

13. The device of claim 12, wherein the gate structure comprises a metal gate material and a high-K gate dielectric.

14. The device of claim 10, wherein the gate stack comprises a metal gate material and a high-k gate dielectric.

15. The device of claim 10, further comprising a contact disposed on one of the end portions of the outer sleeve layer.

16. A semiconductor device, comprising:
    a composite structure that comprises
       an inner core strut that comprises a gate stack; and
       an outer sleeve layer that is sleeved on the gate stack of the inner core strut, wherein the inner core strut mechanically supports the outer sleeve layer and wherein the outer sleeve layer has a central portion that defines a channel region and a pair of opposing end portions that respectively define source and drain regions; and
    a gate structure disposed on the outer sleeve layer at the channel region.

* * * * *